(12) United States Patent
Kimura

(10) Patent No.: US 8,513,350 B2
(45) Date of Patent: *Aug. 20, 2013

(54) POSITIVE TYPE PHOTOSENSITIVE RESIN COMPOSITION

(75) Inventor: Yuuki Kimura, Chiba (JP)

(73) Assignee: JNC Corporation, Tokyo (JP)

( * ) Notice: Subject to any disclaimer, the term of this patent is extended or adjusted under 35 U.S.C. 154(b) by 791 days.

This patent is subject to a terminal disclaimer.

(21) Appl. No.: 12/037,328

(22) Filed: Feb. 26, 2008

(65) Prior Publication Data

US 2008/0207807 A1 Aug. 28, 2008

(30) Foreign Application Priority Data

Feb. 28, 2007 (JP) .................................. 2007-049733

(51) Int. Cl.
| | |
|---|---|
| C08F 30/08 | (2006.01) |
| C08F 130/08 | (2006.01) |
| C08F 230/08 | (2006.01) |
| C08G 77/18 | (2006.01) |
| C08G 77/04 | (2006.01) |
| C08G 77/20 | (2006.01) |
| C08F 16/00 | (2006.01) |
| C08F 16/36 | (2006.01) |

(52) U.S. Cl.
USPC ........... 524/542; 524/189; 524/588; 526/279; 526/319; 526/317.1; 526/316; 528/10; 528/25; 528/32; 528/271

(58) Field of Classification Search
USPC ................. 524/543, 547, 548, 555, 556, 588, 524/599, 606, 502, 506, 515, 522, 523, 80, 524/186, 189, 542, 592; 526/72, 279, 308, 526/319, 317.1, 318, 318.1, 318.4, 323.2, 526/326, 327, 328, 316; 528/10, 25, 26, 528/32, 271
See application file for complete search history.

(56) References Cited

U.S. PATENT DOCUMENTS

| | | | |
|---|---|---|---|
| 4,640,884 A * | 2/1987 | Rowe et al. .................... | 430/165 |
| 5,916,963 A * | 6/1999 | Hashimoto et al. ............ | 524/588 |
| 6,410,206 B1 * | 6/2002 | Ueda et al. ................. | 430/280.1 |
| 7,569,335 B2 * | 8/2009 | Maeda et al. ................. | 430/321 |
| 2003/0049561 A1 * | 3/2003 | Angelopoulos et al. ... | 430/270.1 |
| 2003/0219677 A1 * | 11/2003 | Namba et al. ................ | 430/270.1 |
| 2006/0003256 A1 * | 1/2006 | Takahashi et al. ......... | 430/270.1 |
| 2008/0131813 A1 * | 6/2008 | Etou et al. ................. | 430/280.1 |

FOREIGN PATENT DOCUMENTS

| | | | |
|---|---|---|---|
| EP | 1650601 A2 * | 4/2006 | |
| JP | 51-34711 | 3/1976 | |
| JP | 52-41050 | 10/1977 | |
| JP | 56-122031 | 9/1981 | |
| JP | 5-165214 | 7/1993 | |
| JP | 2005146131 A * | 6/2005 | |

OTHER PUBLICATIONS

Tadashi; Positivelyl photosensitive resin composition and method of pattern formation; Feb. 21, 2006; Nissan Chemical industries.*
English Translation of JP 2005146131 A; Hatakeyama et al; Jun. 2005.*

* cited by examiner

*Primary Examiner* — Karuna P Reddy
(74) *Attorney, Agent, or Firm* — J.C. Patents

(57) ABSTRACT

A positive type photosensitive resin composition for forming patterned resin film is provided. The patterned resin film has high transparency, low dielectric constant, high solvent resistance, high water resistance, high acid resistance, high alkali resistance, high heat resistance, and excellent adhesive properties with the substrate, which is obtained by developing with an alkali solution. The positive type photosensitive resin composition contains copolymer of compound of formula (I) and 1,2-quinonediazido compound, or further mixes with other alkali-soluble polymers,

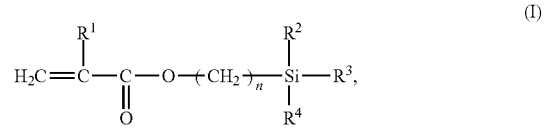

(I)

in formula (I), $R^1$ is hydrogen or alkyl group having 1-5 carbon atoms in which any hydrogen may be replaced by fluorine; and $R^2$, $R^3$ and $R^4$ are independently hydroxyl group, alkyl group having 1-5 carbon atoms, alkoxyl group having 1-5 carbon atoms or $-O(Si(C_lH_{2l+1})_2O)_mSi(C_pH_{2p+1})_3$, l is an integer of 1-5, m is 0 or an integer of 1-10, n is an integer of 1-5, and p is an integer of 1-5.

19 Claims, No Drawings

POSITIVE TYPE PHOTOSENSITIVE RESIN COMPOSITION

CROSS-REFERENCE TO RELATED APPLICATION

This application claims the priority benefit of Japanese application serial no. 2007-49733, filed Feb. 28, 2007. All disclosure of the Japanese application is incorporated herein by reference.

BACKGROUND OF THE INVENTION

1. Field of the Invention

The invention relates to a positive type photosensitive resin composition, applicable for the field of resist, etc.

2. Description of Related Art

A patterned transparent film is applied in many parts of display devices, such as spacer, insulating film, protective film, etc. Till now, a variety of positive type photosensitive resin compositions have been proposed for being applied in the above applications (for example, with reference to Japanese Patent Publication No. S51-34711, Japanese Patent Publication No. S56-122031, and Japanese Patent Publication No. H05-165214). Furthermore, it has been proposed a positive type photosensitive resin composition containing a polymer with 4-hydroxystyrene as a monomer (for example, with reference to Japanese Patent Publication No. S52-41050).

Generally, as for electronic parts such as thin film transistor liquid crystal display (TFT-LCD) devices, solid-state imaging devices, etc., an insulating film is disposed between layered wires for isolation. Positive type photosensitive resin compositions are widely used as a material for forming such insulating film. When using such a composition, the process for obtaining the insulating film with desired patterns requires fewer procedures. During the process for forming the insulating film, the positive type photosensitive resin composition is required to have a wide process margin. Furthermore, the insulating film or display device made by using the positive type photosensitive resin composition is unavoidably immersed in a solvent, acid, or an alkali solution to perform the contact and heat treatment in the post-process.

In view of the above circumstances, it is necessary to develop a positive type photosensitive resin composition having high solvent resistance, high water resistance, high acid resistance, high alkali resistance, high heat resistance, high transparency, excellent adhesive properties with the substrate, and capable of forming a patterned resin film (i.e., a patterned transparent film) by developing with an aqueous alkali solution.

Similarly, it is also necessary to develop a patterned transparent film or an insulating film having high solvent resistance, high water resistance, high acid resistance, high alkali resistance, high heat resistance, high transparency, excellent adhesive properties with the substrate, etc., as well as a display device having the patterned transparent film.

SUMMARY OF THE INVENTION

The inventor of the invention has disclosed a positive type photosensitive resin composition. The composition contains a copolymer (A) and 1,2-quinonediazido compound (B). The copolymer (A) is obtained by polymerizing monomers (a1) of a general formula (I) with other free radical polymerizable monomers (a2). The inventor of the invention has completed the invention based upon the above idea. The invention includes the following items.

1. A photosensitive resin composition, including a copolymer (A) and 1,2-quinonediazido compound (B), in which the copolymer (A) is obtained by polymerizing free radical polymerizable monomers (a1) of general formula (I) with other free radical polymerizable monomers (a2).

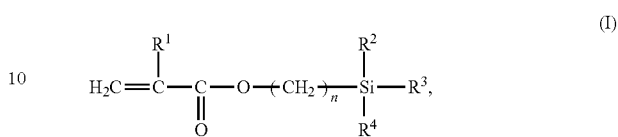

(In the general formula (I), $R^1$ is hydrogen or an alkyl group having 1-5 carbon atoms in which any hydrogen may be replaced by fluorine; and $R^2$, $R^3$, and $R^4$ are independently hydroxyl group, an alkyl group having 1-5 carbon atoms, an alkoxyl group having 1-5 carbon atoms or —O(Si $(C_lH_{2l+1})_2O)_mSi(C_pH_{2p+1})_3$, l is an integer of 1-5, m is 0 or an integer of 1-10, n is an integer of 1-5, and p is an integer of 1-5.)

2. The photosensitive resin composition according to Item 1, further including an alkali-soluble copolymer (C), in which the alkali-soluble copolymer (C) is obtained by polymerizing one or more selected from free radical polymerizable monomers having unsaturated carboxylic acid, free radical polymerizable monomers having unsaturated carboxylic anhydride, and free radical polymerizable monomers having phenolic OH.

3. The photosensitive resin composition according to Item 1 or 2, in which the other free radical polymerizable monomers (a2) include at least one of free radical polymerizable monomers having epoxy group.

4. The photosensitive resin composition according to Item 1 or 2, in which the other free radical polymerizable monomers (a2) include one or more selected from free radical polymerizable monomers having unsaturated carboxylic acid, free radical polymerizable monomers having unsaturated carboxylic anhydride, and free radical polymerizable monomers having phenolic OH.

5. The photosensitive resin composition according to any one of Items 1 to 4, in which the other free radical polymerizable monomers (a1) are selected from free radical polymerizable monomers having phenolic OH of general formula (II).

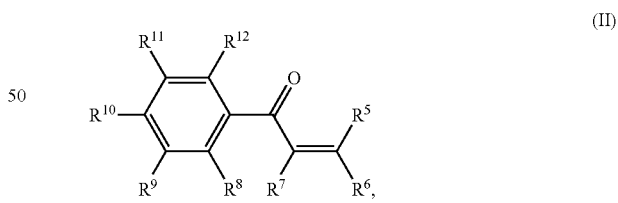

(In the general formula (II), $R^5$, $R^6$ and $R^7$ are independently hydrogen or an alkyl group having 1-3 carbon atoms in which any hydrogen may be replaced by fluorine; $R^8$, $R^9$, $R^{10}$, $R^{11}$, and $R^{12}$ are independently hydrogen, halogen, —CN, —CF$_3$, —OCF$_3$, —OH, an alkyl group having 1-5 carbon atoms in which any —CH$_2$— may be replaced by —COO—, —OCO—, —CO— or any hydrogen may be replaced by halogen, or an alkoxyl group having 1-5 carbon atoms in which any hydrogen may be replaced by halogen, in which at least one of $R^8$, $R^9$, $R^{10}$, $R^{11}$, and $R^{12}$ is —OH).

6. The photosensitive resin composition according to any one of Items 2 to 5, in which the alkali-soluble copolymer (C)

is obtained by polymerizing free radical polymerizable monomers having phenolic OH of general formula (II).

7. The photosensitive resin composition according to any one of Items 2 to 5, in which the alkali-soluble copolymer (C) is obtained by polymerizing free radical polymerizable monomers of general formula (I).

8. The photosensitive resin composition according to any one of Items 1 to 7, in which the free radical polymerizable monomers (al) are one or more selected from 3-methacryloxypropyltrimethoxysilane and methacryloxypropyl-tris-trimethylsiloxysilane.

9. The photosensitive resin composition according to Item 3, in which the free radical polymerizable monomers having epoxy group include one or more compounds selected from glycidyl(meth)acrylate, methylglycidyl(meth)acrylate, 3,4-epoxycyclohexylmethyl(meth)acrylate, 3-methyl-3-(meth)acryloxymethyloxetane, 3-ethyl-3-(meth)acryloxymethyloxetane, 3-methyl-3-(meth)acryloxyethyloxetane, and 3-ethyl-3-(meth)acryloxyethyloxetane.

10. The photosensitive resin composition according to any one of Items 1 to 9, in which the free radical polymerizable monomers (a2) include at least one of (meth)acrylic acid, maleic anhydride, hydroxystyrene, and 4-hydroxyphenyl vinyl ketone.

11. The photosensitive resin composition according to any one of Items 2 to 10, in which the alkali-soluble copolymer (C) is obtained by polymerizing one or more free radical polymerizable monomers selected from (meth)acrylic acid, maleic anhydride, hydroxystyrene, and 4-hydroxyphenyl vinyl ketone.

12. The photosensitive resin composition according to any one of Items 2 to 11, in which the alkali-soluble copolymer (C) include at least one of free radical polymerizable monomers having N-substituted maleimide and free radical polymerizable monomers having dicyclopentanyl group.

13. The photosensitive resin composition according to Item 12, in which the N-substituted maleimide is selected from N-methyl maleimide, N-ethyl maleimide, N-butyl maleimide, N-cyclohexyl maleimide, N-benzyl maleimide, N-phenyl maleimide, N-(4-acetylphenyl)maleimide, N-(2,6-diethylphenyl)maleimide, N-(4-dimethylamino-3,5-dinitrophenyl)maleimide, N-(1-anilinonaphthyl-4)maleimide, N-[4-(2-benzoxazolyl)phenyl]maleimide, and N-(9-acridinyl)maleimide.

14. The photosensitive resin composition according to any one of Items 1 to 13, in which the free radical polymerizable monomers having dicyclopentyl group are dicyclopentanyl (meth)acrylate.

15. A patterned transparent film formed by the positive type photosensitive resin composition according to any one of Items 1 to 14.

16. An insulating film, using the patterned transparent film according to Item 15.

17. A display device, including the patterned transparent film according to Item 15.

In this specification, "(meth)acrylic acid" refers to both "acrylic acid" and "methacrylic acid". Similarly, "(meth) acrylate" refers to both "acrylate" and "methacrylate".

In this specification, "alkyl" refers to straight-chain or branched-chain alkyl group, for example, methyl, ethyl, propyl, butyl, pentyl, hexyl and etc.

The positive type photosensitive resin composition of the invention has excellent transparency, low dielectric constant, high solvent resistance, high acid resistance, high alkali resistance, and high heat resistance. Therefore, no cracks will occur on the surface of the resin film made by the positive type photosensitive resin composition, such as transparent film, insulating film, display device and etc., even if they contact with or immersed within a liquid of a solvent, an acid, an alkali solution, or subjected to heat treatment during the post-process of the manufacturing process. In this manner, the resin film made by the positive type photosensitive resin composition of the invention, such as transparent film, has high light transmittance, and the display device using the resin film has an increased display quality.

BRIEF DESCRIPTION OF THE DRAWINGS

No Drawings.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

<1-1. Copolymer (A)>

Copolymer (A) of the invention is obtained by polymerizing the free radical polymerizable monomers (a1) of general formula (I) with other free radical polymerizable monomers (a2). That is, the copolymer (A) is a copolymer obtained by polymerizing a monomer mixture.

The copolymer (A) may include a plurality of free radical polymerizable monomers as the free radical polymerizable monomers (a2).

<1-1-1. Monomer (a1) of General Formula (I)>

The free radical polymerizable monomers (a1) of general formula (I) include, for example, 3-methacryloxypropyltrimethoxysilane or methacryloxypropyl-tris-trimethylsiloxysilane. When using the copolymer of the above free radical polymerizable monomers, the initial transparency is high, and the deterioration of transparency caused by high-temperature baking hardly occurs. Furthermore, the copolymer has a high solubility in an aqueous alkali solution during developing, that is, the developability is high, and thus a patterned transparent film is easily obtained by developing, and has high solvent resistance, high water resistance, high acid resistance, high alkali resistance, high heat resistance, and excellent adhesive properties with the substrate.

<1-1-2. Free Radical Polymerizable Monomers (a2) Having Epoxy Group>

The specific examples of the free radical polymerizable monomers (a2) having epoxy group used in the invention include, for example, glycidyl(meth)acrylate, methylglycidyl (meth)acrylate, alpha-ethylglycidyl acrylate, 3,4-epoxycyclohexylmethyl (meth)acrylate, 3-methyl-3-(meth)acryloxymethyloxetane, 3-ethyl-3-(meth)acryloxymethyloxetane, 3-methyl-3-(meth)acryloxyethyloxetane, or 3-ethyl-3-(meth)acryloxyethyloxetane. When using the copolymer of the above free radical polymerizable monomers, the sputtering resistance is excellent, and the transparency is increased.

In the above specific embodiments, considering the factors that the patterned transparent film has a high solvent resistance, high water resistance, high acid resistance, high alkali resistance, high heat resistance, and high transparency, glycidyl (meth)acrylate, methylglycidyl (meth)acrylate, 3,4-epoxycyclohexylmethyl (meth)acrylate, and 3-ethyl-3-(meth)acryloxymethyloxetane are preferred. And these compounds are easily available.

Furthermore, the free radical polymerizable monomers having epoxy group may be used as a single monomer or used as a mixture of several monomers.

<1-1-3. Other Free Radical Polymerizable Monomers (a2)>

The free radical polymerizable monomers (a2) used in the invention preferably includes: free radical polymerizable monomers having unsaturated carboxylic acid, free radical polymerizable monomers having unsaturated carboxylic anhydride, and free radical polymerizable monomers having phenolic OH. The specific examples of the free radical polymerizable monomers (a2) include, for example, (meth)acrylic acid, maleic anhydride, hydroxystyrene, or 4-hydroxyphenyl vinyl ketone. In consideration of high alkali solubility, the copolymer of the above free radical polymerizable monomers is preferably used.

In the above specific embodiments, methacrylic acid, hydroxystyrene, or 4-hydroxyphenyl vinyl ketone is preferred. Methacrylic acid and hydroxystyrene are easily available, and when using 4-hydroxyphenyl vinyl ketone, the transparency and heat resistance are excellent.

Besides the free radical polymerizable monomers having unsaturated carboxylic acid, free radical polymerizable monomers having unsaturated carboxylic anhydride, and free radical polymerizable monomers having phenolic OH, the copolymer (A) may include other free radical polymerizable monomers as the free radical polymerizable monomers (a2).

The copolymer (A) of the invention is obtained by free-radical polymerization of the monomers (a1) with the monomers (a2). The free-radical polymerization may be performed by using a well known polymerization initiator.

<1-2. Alkali-Soluble Copolymer (C)>

The alkali-soluble copolymer (C) of the invention includes, for example, free radical polymerizable monomers having unsaturated carboxylic acid, free radical polymerizable monomers having unsaturated carboxylic anhydride, and free radical polymerizable monomers having phenolic OH. The specific examples of the copolymer (C) include, for example, (meth)acrylic acid, maleic anhydride, hydroxystyrene, or 4-hydroxyphenyl vinyl ketone. In consideration of high alkali solubility, the copolymer of the above free radical polymerizable monomers is preferably used.

The alkali-soluble copolymer (C) includes, for example, N-substituted maleimide and free radical polymerizable monomers having dicyclopentanyl group. In consideration of high heat resistance and low dielectric constant, the above free radical polymerizable monomers are preferably used.

The specific examples of N-substituted maleimide include, for example, N-methyl maleimide, N-ethyl maleimide, N-butyl maleimide, N-cyclohexyl maleimide, N-benzyl maleimide, N-phenyl maleimide, N-(4-acetylphenyl)maleimide, N-(2,6-diethylphenyl)maleimide, N-(4-dimethylamino-3,5-dinitrophenyl)maleimide, N-(1-anilinonaphthyl-4)maleimide, N-[4-(2-benzoxazolyl)phenyl]maleimide, or N-(9-acridinyl)maleimide.

The specific examples of the free radical polymerizable monomers having dicyclopentanyl group include, for example, dicyclopentanyl acrylate or dicyclopentanyl methacrylate.

Moreover, besides N-substituted maleimide and free radical polymerizable monomers having dicyclopentanyl group, the alkali-soluble copolymer (C) may include other free radical polymerizable monomers in the scope without influencing the effects of the invention.

Furthermore, the alkali-soluble polymers of the invention may be tested by using GC-MS to detect the gas generated when the alkali-soluble polymers is heat decomposed, for example, so as to detect the monomer ingredients thereof.

When the alkali-soluble polymer (C) is used, the photosensitive resin composition of the invention has high solubility in an aqueous alkali solution; that is, the developability is high, and thus, a patterned transparent film is easily obtained. Furthermore, in consideration of low dielectric constant, high solvent resistance, high water resistance, high acid resistance, high alkali resistance, and high heat resistance, the alkali-soluble polymer (C) is preferred.

<1-3. Polymerization Method of Copolymer (A) and Alkali-Soluble Copolymer (C)>

The polymerization method of the copolymer (A) and the alkali-soluble copolymer (C) is not particularly limited. The copolymer (A) may be obtained by polymerizing the mixture of the free radical polymerizable monomers (a1) and the free radical polymerizable monomers (a2), and the free-radical polymerization is preferably performed in a solution by using a solvent. The polymerization temperature is not specially limited, as long as it is sufficient high for the polymerization initiator to generate sufficient free radicals, which is generally in the range of 50° C.-150° C. The duration of the polymerization is not limited, which is generally in the range of 1 hour-24 hours. The polymerization may be performed at an increased pressure, reduced pressure, or atmospheric pressure.

The solvent used in the polymerization is preferably a solvent capable of dissolving the free radical polymerizable monomers and the generated copolymer (A) and the alkali-soluble copolymer (C). The specific examples of the solvent include, for example, methanol, ethanol, 1-propanol, 2-propanol, acetone, 2-butanone, ethyl acetate, propyl acetate, tetrahydrofuran, acetonitrile, dioxane, toluene, xylene, cyclohexanone, ethylene glycol monoethyl ether, propylene glycol monomethyl ether, propylene glycol monomethyl ether acetate, diethylene glycol dimethyl ether, diethylene glycol methyl ethyl ether, methyl 3-methoxypropionate, ethyl 3-ethoxypropionate, N,N-dimethylformamide, acetic acid, or water. The solvents may be used as a single solvent or used as a mixture of two or more solvents.

The polymerization initiator used in the synthesis of the copolymer (A) and the alkali-soluble copolymer (C) may be a compound capable of generating free radicals upon being heated, azo initiator, such as azodiisobutyronitrile, or peroxide initiator, such as benzoyl peroxide. Appropriate amount of chain transfer agent, such as thioglycolic acid may be added to adjust the molecular weight.

As for the copolymer (A) and the alkali-soluble copolymer (C), when GPC analysis is performed by taking polyoxyethylene as the standard, if the obtained weight average molecular weight is in the range of 1,000-100,000, the development is preferably performed till the exposed part is dissolved by the alkali developing solution, and the film surface is not easily cracked during the development, so that the weight average molecular weight is preferably in the above range of 1,000-100,000. Moreover, if the weight average molecular weight is in the range of 1,500-50,000, the development is preferably performed till the unexposed part is dissolved by the alkali developing solution, the film surface is not easily cracked during the development, and there is an extremely small amount of development residue left, so that the weight average molecular weight is more preferably in the above range of 1,500-50,000. According to the same reason, the weight average molecular weight is most preferably in the range of 2,000-20,000.

The weight average molecular weight of the copolymer (A) and the alkali-soluble copolymer (C) may be determined under the following conditions, for example, polyoxyethylene having a molecular weight of 1,000-510,000 is taken as the standard polyoxyethylene (for example, TSK standard, manufactured by TOSHO Co., Ltd.), Shodex KD-806M (manufactured by Showadenko Co., Ltd.) is taken as the column, and DMF is taken as a mobile phase.

<2. Positive Type Photosensitive Resin Composition of the Invention>

The positive type photosensitive resin composition of the invention includes the copolymer (A) and 1,2-quinonediazido compound (B). The copolymer (A) is obtained by copolymerizing the monomers (a1) of general formula (I) with other free radical polymerizable monomers (a2). The positive type photosensitive resin composition may further include an alkali-soluble copolymer (C).

<2-1. 1,2-quinonediazido Compound (B)>

As for the 1,2-quinonediazido compound (B), a compound used as a photosensitive agent in the photoresist field may be used. The 1,2-quinonediazido compound (B) includes, for example, ester of phenolic compounds and 1,2-benzoquinonediazido-4-sulfonic acid or 1,2-benzoquinonediazido-5-sulfonic acid, ester of phenolic compounds and 1,2-naphthoquinonediazido-4-sulfonic acid or 1,2-naphthoquinonediazido-5-sulfonic acid, sulfonamide of phenolic compounds having hydroxyl being replaced by amino and 1,2-benzoquinonediazido-4-sulfonic acid or 1,2-benzoquinonediazido-5-sulfonic acid, or sulfonamide of phenolic compounds having hydroxyl being replaced by amino and 1,2-naphthoquinonediazido-4-sulfonic acid or 1,2-naphthoquinonediazido-5-sulfonic acid. The above compounds may be used as a single compound or used as a combination of two or more compounds.

The specific examples of phenolic compounds include, for example, 2,3,4-trihydroxy benzophenone, 2,4,6-trihydroxy benzophenone, 2,2',4,4'-tetrahydroxy benzophenone, 2,3,3',4-tetrahydroxy benzophenone, 2,3,4,4'-tetrahydroxy benzophenone, bis(2,4-dihydroxyphenyl)methane, bis(p-hydroxyphenyl)methane, tri(p-hydroxyphenyl)methane, 1,1,1-tri(p-hydroxyphenyl)ethane, bis(2,3,4-trihydroxyphenyl) methane, 2,2-bis(2,3,4-trihydroxyphenyl)propane, 1,1,3-tri (2,5-dimethyl-4-hydroxyphenyl)-3-phenylpropane, 4,4'-[1-[4-[1-[4-hydroxyphenyl]-1-methylethyl]phenyl]ethylidene]bisphenol, bis(2,5-dimethyl-4-hydroxyphenyl)-2-hydroxyphenyl methane, 3,3,3',3'-tetramethyl-1,1'-spirobiindene-5,6,7,5',6',7'-hexanol, or 2,2,4-trimethyl-7,2',4'-trihydroxyflavane.

Considering to increase the transparency of the positive type photosensitive resin composition, the 1,2-quinonediazido compound (B) is preferably an ester of 2,3,4-trihydroxy benzophenone and 1,2-naphthoquinonediazido-4-sulfonic acid, ester of 2,3,4-trihydroxy benzophenone and 1,2-naphthoquinonediazido-5-sulfonic acid, ester of 4,4'-[1-[4-[1-[4-hydroxyphenyl]-1-methylethyl]phenyl]ethylidene]bisphenol and 1,2-naphthoquinonediazido-4-sulfonic acid, or ester of 4,4'-[1-[4-[1-[4-hydroxyphenyl]-1-methylethyl]phenyl]ethylidene]bisphenol and 1,2-benzoquinonediazido-5-sulfonic acid. The above compounds may be used as a single compound or used as a combination of two or more compounds.

In the positive type photosensitive resin composition of the invention, based on 100 weight parts of the total weight of the copolymer (A) and the alkali-soluble copolymer (C), the content of 1,2-quinonediazido compound is preferably 5-50 weight parts.

<2-2. Solvent>

Besides the copolymer and the 1,2-quinonediazido compound, the positive type photosensitive resin composition of the invention preferably further includes a solvent. The used solvent is preferably capable of dissolving the copolymer (A) and the alkali-soluble copolymer (C), and the 1,2-quinonediazido compound.

The solvent used in the invention is preferably a compound with a boiling point of 100° C.-300° C. The specific examples of the solvent with a boiling point of 100° C.-300° C. include, for example, water, butyl acetate, butyl propionate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-hydroxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, ethyl 2-oxobutanoate, dioxane, ethylene glycol, diethylene glycol, triethylene glycol, propylene glycol, dipropylene glycol, tripropylene glycol, 1,4-butanediol, ethylene glycol monoisopropyl ether, ethylene glycol monobutylether, propylene glycol monomethyl ether, propylene glycol monomethyl ether acetate, propylene glycol monoethyl ether acetate, propylene glycol monopropyl ether acetate, ethylene glycol monobutyl ether acetate, cyclohexanone, cyclopentatone, diethylene glycol monomethyl ether, diethylene glycol monomethyl ether acetate, diethylene glycol monoethyl ether, diethylene glycol monoethyl ether acetate, diethylene glycol monobutyl ether, diethylene glycol monobutyl ether acetate, diethylene glycol dimethyl ether, diethylene glycol diethyl ether, diethylene glycol methylethyl ether, toluene, xylene, γ-butyrolactone, or N,N-dimethylacetamide. The solvents may be used as a single solvent or used as a mixture of two or more solvents.

The solvent used in the invention may be a mixed solvent that contains greater than or equal to 20 wt % of the above solvent with a boiling point of 100° C.-300° C. In the mixed solvent, besides the solvent with a boiling point of 100° C.-300° C., one or two or more well-known solvents may be used.

As the solvent contained in the positive type photosensitive resin composition, if at least one solvent selected from propylene glycol monomethyl ether, propylene glycol monomethyl ether acetate, propylene glycol monoethyl ether acetate, methyl 3-methoxypropionate, ethyl 3-ethoxypropionate, diethylene glycol monoethyl ether acetate, diethylene glycol monobutyl ether acetate, diethylene glycol dimethyl ether, diethylene glycol methylethyl ether, ethyl lactate, and butyl aceate is used, the coating uniformity is increased, which is more preferred. Moreover, considering to increase the coating uniformity and the safety to human bodies of the positive type photosensitive resin composition, at least one solvent selected from propylene glycol monomethyl ether acetate, methyl 3-methoxypropionate, ethyl 3-ethoxypropionate, diethylene glycol methylethyl ether, ethyl lactate, and butyl acetate is more preferably used.

In the positive type photosensitive resin composition of the invention, the solvent is preferably added in such amount that, the content of the copolymer and the photosensitive agent as the solid contents is 5-50 wt % based on the total amount of the copolymer, 1,2-quinonediazido compound and the solvent.

<2-3. Other Components>
<2-3-1. Additive>

In order to improve the resolution, coating uniformity, development, adhesive properties, a variety of additives may be added to the positive type photosensitive resin composition of the invention. The additives include, for example, acrylic type, styrene type, polyethyleneimine type or urethane type polymer dispersing agents; anionic type, cationic type, non-ionic type, or fluorine type surfactants; coating enhancing agent, such as silicone resin type; adhesive enhancing agents, such as silane coupling agent; alkoxyl benzophenone type UV absorbers; anticoagulants, such as sodium polyacrylate; heat crosslinkers, such as epoxy compounds, melamine compounds, or bisazide compounds; and alkali-soluble accelerators, such as organic carboxylic acid.

The specific examples of the additives include, POLYFLOW No. 45, POLYFLOW KL-245, POLYFLOW No. 75, POLYFLOW No. 90, POLYFLOW No. 95 (all these are trademarks, and manufactured by Kyoeisha Chemical Co., Ltd.), Disperbyk161, Disperbyk162, Disperbyk163, Disperbyk164, Disperbyk166, Disperbyk170, Disperbyk180, Disperbyk181, Disperbyk182, BYK300, BYK306, BYK310, BYK320, BYK330, BYK344, BYK346 (all these are trademarks, and manufactured by BYK-Chemie Japan Co., Ltd.), KP-341, KP-358, KP-368, KF-96-50CS, KF-50-100CS (all these are trademarks, and manufactured by Shin-Etsu Chemical Co., Ltd.), Surflon SC-101, Surflon KH-40 (all these are trademarks, and manufactured by Seimi Chemical Co., Ltd.), Ftergent 222F, Ftergent 251, FTX-218 (all these are trademarks, and manufactured by NEOS Co., Ltd.), EFTOP EF-351, EFTOP EF-352, EFTOP EF-601, EFTOP EF-801, EFTOP EF-802 (all these are trademarks, and manufactured by Mitsubishi Material Co., Ltd.), Megaface F-171, Megaface F-177, Megaface F-475, Megaface R-08, Megaface R-30 (all these are trademarks, manufactured by Dainippon Ink and Chemicals Incorporated Co., Ltd.), fluoroalkyl benzenesulfonate, fluoroalkyl carboxylate, fluoroalkyl polyoxyethylene ether, fluoroalkyl ammonium iodide, fluoroalkylbetaine, fluoroalkyl sulfonate, diglycerine tetrakis(fluoroalkyl polyoxyethylene ether), fluoroalkyl trimethyl ammonium, fluoroalkyl aminosulfonate, polyoxyethylene nonyl phenyl ether, polyoxyethylene octyl phenyl ether, polyoxyethylene alkyl ether, polyoxyethylene lauryl ether, polyoxyethylene oleyl ether, polyoxyethylene tridecyl ether, polyoxyethylene cetyl ether, polyoxyethylene stearyl ether, polyoxyethylene laurate, polyoxyethylene oleate, polyoxyethylene stearate, polyoxyethylene lauryl amine, sorbitan laurate, sorbitan palmitate, sorbitan stearate, sorbitan oleate, sorbitan fatty acid ester, polyoxyethylene sorbitan laurate, polyoxyethylene sorbitan palmitate, polyoxyethylene sorbitan stearate, polyoxyethylene sorbitan oleate, polyoxyethylene naphthyl ether, alkylbenzenesulfonate, or alkyl diphenyl ether disulfonate. Preferably, at least one selected from the above additives is used as the additive.

Among the above additives, at least one selected from fluorinated surfactants, such as fluoroalkylbenzenesulfonate, fluoroalkylcarboxylate, fluoroalkylpolyoxyethylene ether, fluoroalkylammonium iodide, fluoroalkylbetaine, fluoroalkylsulfonate, diglycerine tetrakis(fluoroalkylpolyoxyethylene ether), fluoroalkyltrimethyl ammonium, or fluoroalkylaminosulfonate; and silicone resin coating enhancing agent, such as BYK306, BYK344, BYK346, KP-341, KP-358, or KP-368 is preferably used, such that the coating uniformity of the positive type photosensitive resin composition is enhanced.

<2-3-2. Poly-carboxylic Acid>

Poly-carboxylic acid, such as trimellitic anhydride, phthalic anhydride, or 4-methylcyclohexane-1,2-dicarboxylic anhydride, may be added into the positive type photosensitive resin composition of the invention. Among the poly-carboxylic acids, trimellitic anhydride is preferred.

When the above poly-carboxylic acid is added into the positive type photosensitive resin composition of the invention while they are being heated, the carboxyl group of the poly-carboxylic acid reacts with the epoxy group if the positive type photosensitive resin composition has an epoxy group; thus, the heat resistance and chemical resistance are further improved. Furthermore, if the poly-carboxylic acid is added into the positive type photosensitive resin composition of the invention, the decomposition of the 1,2-quinonediazido compound during storage may be inhibited; thus, the positive type photosensitive resin composition is prevented from be colored.

When the poly-carboxylic acid is added into the positive type photosensitive resin composition of the invention, the content of the poly-carboxylic acid is preferably 1-30 weight parts, and more preferably 2-20 weight parts, based on 100 weight parts of the total weight of the copolymer (A) and the alkali-soluble copolymer (C).

<2-4. Storage of the Positive Type Photosensitive Resin Composition>

The positive type photosensitive resin composition of the invention is preferably stored in the dark at a temperature in the range of −30° C.-25° C., which has a desirable overtime stability. More preferably, the storage temperature is −20° C.-10° C. and no substance is deposited.

<3. Resin Film Formed by the Positive Type Photosensitive Resin Composition of the Invention>

The photosensitive resin composition of the invention is applicable for forming a transparent resin film, and it is especially applicable for forming an insulating film having small holes with a diameter of less than or equal to 10 μm, since the resolution thereof is relatively high during patterning. Herein, the so-called insulating film is, for example, a film provided for isolating layered wires (an interlayer insulating film).

The resin film, such as the transparent film and the insulating film, may be formed by a conventional method for forming a resin film in the photoresist field, for example, by the following manner.

Firstly, the positive type photosensitive resin composition of the invention is coated on a substrate such as a glass by a conventional method, such as spin coating, roller coating, and slit coating. The substrate is, for example, a transparent glass substrate, such as white plate glass, blue plate glass, silica-coat blue plate glass; sheet, film, or substrate made of synthetic resin, such as polycarbonate, polyethersulfone, polyester, acrylic resin, vinyl chloride resin, aromatic polyamide resin, polyamideimide, polyimide; metal substrate, such as aluminum plate, copper plate, nickel plate, stainless steel plate; another ceramic plate; semiconductor substrate having photoelectric device. The substrates may be optionally pre-treated by chemicals (such as silane coupling agent), plasma, ion spraying, sputtering, gas-phase reaction, vacuum evaporation depending upon actual requirements.

Next, the positive type photosensitive resin composition film on the substrate is dried by a hot plate or an oven. Generally, the film is dried at a temperature of 60° C.-120° C. for 1-5 min. The dried film on the substrate is irradiated by radioactive rays, such as UV rays, through a mask with a desired pattern. The irradiation condition varies with the type of the photosensitive agent in the positive type photosensitive resin composition. For example, if the photosensitive agent is 1,2-quinonediazido compound, i-line with an intensity of 5-1,000 $mJ/cm^2$ is appropriately used. The part of the 1,2-quinonediazido compound irradiated by UV rays is formed into indene carboxylic acid and then rapidly dissolved in the developing solution.

Then, the film after being irradiated by the rays is developed by using a developing solution, such as an alkali solution. The part of the film irradiated by the rays is rapidly dissolved in the developing solution during such a developing process. The developing process is not specially limited, which may adopt any one of dip developing, puddle developing, and spray developing.

The developing solution is preferably an alkali solution. The alkali contained in the alkali solution includes, for example, tetramethylammonium hydroxide, tetraethylammonium hydroxide, 2-hydroxyethyltrimethylammonium hydroxide, sodium carbonate, sodium bicarbonate, potassium carbonate, potassium bicarbonate, sodium hydroxide, or potassium hydroxide. An aqueous solution of the above alkali is preferably used as the developing solution. That is, the developing solution includes, for example, aqueous solutions of organic alkali, such as tetramethylammonium hydroxide, tetraethylammonium hydroxide, or 2-hydroxyethyltrimethylammonium hydroxide; or aqueous solutions of inorganic alkali, such as sodium carbonate, sodium hydroxide, or potassium hydroxide.

Methanol, ethanol, or a surfactant may be added into the developing solution, to reduce the developing solution residue or to provide the pattern with a proper shape. The surfactant includes, for example, anionic type, cationic type, and non-ionic type surfactants. Among these surfactants, in the consideration of improving the resolution, the non-ionic type surfactant, such as polyoxyethylene alkyl ether, is preferably added.

Thereafter, the film after being developed is washed thoroughly with pure water, and then the whole film on the substrate is irradiated by radioactive rays. For example, if the film is irradiated by UV rays, the intensity of the rays is 100-1,000 mJ/cm$^2$. Finally, the film on the substrate after being irradiated for a second time is baked at 180° C.-250° C. for 10-120 min. In this way, a desirable patterned transparent film is obtained.

The patterned transparent film obtained by such a process may be used as a patterned insulating film. When viewing from the above, the holes formed on the insulating film are preferably square, rectangular, round, or oval in shape. Moreover, a transparent electrode may be formed on the insulating film and then patterned by etching to form a film on which an aligning process has been performed. As the insulating film has high sputtering resistance, even if a transparent electrode is formed thereon, the insulating film is not corrugated, but keeps a high transparency.

<4. Display Device Having the Resin Film>

The resin film, such as the transparent film and insulating film is applicable for display devices using liquid crystals or other materials. The display devices may be manufactured as follows. First, a device substrate with the patterned transparent film or insulating film disposed thereon and an opposite substrate, i.e., a color filter substrate, are placed face to face, and have a position put together; and meanwhile they are laminated together; then, the two substrates are heat treated to be combined; then, liquid crystals are injected into the space between the two substrates; and finally, the inlet for injection is sealed to complete the display device.

Alternatively, the display devices may be manufactured as follows. After dispersing liquid crystals on the device substrates, the device substrates are overlapped and then sealed, such that the liquid crystals may not be leaked, so as to finish the display device.

In this manner, the insulating film having an excellent transparency formed by using the positive type photosensitive resin composition of the invention can be used for manufacturing liquid crystal display (LCD) devices. It should be noted that, the liquid crystals, i.e., liquid crystal compound and liquid crystal composition, used in the LCD devices of the invention are not specially limited, but any kind of liquid crystal compounds and liquid crystal compositions may be used.

The positive type photosensitive resin composition in the embodiments of the invention has, for example, various properties as required for the patterned transparent film and insulating film, such as high solvent resistance, high water resistance, high acid resistance, high alkali resistance, high heat resistance, high transparency, excellent adhesive properties with the substrate, etc.

Furthermore, the positive type photosensitive resin composition in the embodiments of the invention has excellent solvent resistance, high acid resistance, high alkali resistance, high heat resistance, and high transparency, such that the transparent film, the insulating film, and the display device made of the positive type photosensitive resin composition are not easily cracked during the post process of the manufacturing process, even if they contact with or are immersed in a liquid of a solvent, an acid, an alkali solution, or subjected to heat treatment. Therefore, the resin film made by the positive type photosensitive resin composition of the invention, such as the transparent film, has high light transmittance, and the display device using the resin film has an increased display quality.

EXAMPLES

The invention is further illustrated below by the following Examples, but the invention is not limited thereto.

Synthesis Example 1

Synthesis of Copolymer (A1)

The following ingredients were respectively fed into a 4-neck flask equipped with a stirrer at the following weight: methyl 3-methoxypropionate as a polymerization solvent; 3-methacryloxypropyltrimethoxysilane as a monomer (a1); 4-hydroxyphenyl vinyl ketone, glycidyl methacrylate, and (3-ethyl-3-oxetanyl) methacrylate as monomers (a2); and 2,2'-azobis(2,4-dimethylvaleronitrile) as a polymerization initiator, and then, they are heated at a polymerization temperature of 80° C. for 4 hrs, to perform polymerization.

| | |
|---|---|
| Methyl 3-methoxypropionate | 200.0 g |
| 3-methacryloxypropyltrimethoxysilane | 30.0 g |
| 4-hydroxyphenyl vinyl ketone | 10.0 g |
| Glycidyl methacrylate | 40.0 g |
| (3-ethyl-3-oxetanyl) methacrylate | 20.0 g |
| 2,2'-azobis(2,4-dimethylvaleronitrile) | 5.0 g |

The reaction solution was cooled to room temperature to get the copolymer (A1).

Sampling a part of the solution, the weight average molecular weight thereof was determined by the GPC analysis (with polyoxyethylene as the standard). As a result, the weight average molecular weight of the copolymer (A1) was 5,800.

Synthesis Example 2

Synthesis of Copolymer (A2)

The copolymer (A2) was synthesized by the same way as that of Synthesis Example 1, in which the following ingredients were fed at the following weight to perform the polymerization.

| | |
|---|---|
| Methyl 3-methoxypropionate | 200.0 g |
| 3-methacryloxypropyltrimethoxysilane | 30.0 g |
| Glycidyl methacrylate | 30.0 g |
| Styrene | 35.0 g |
| Methacrylic acid | 5.0 g |
| 2,2'-azobis(2,4-dimethylvaleronitrile) | 5.0 g |

After being treated by the same way as that of Synthesis Example 1, the copolymer (A2) is obtained, and the weight average molecular weight thereof determined by the GPC analysis (with the polyoxyethylene as standard) was 5,000.

Synthesis Example 3

Synthesis of Copolymer (A3)

The copolymer (A3) was synthesized by the same way as that of Synthesis Example 1, in which the, following ingredients were fed at the following weight to perform the polymerization.

| | |
|---|---|
| Methyl 3-methoxypropionate | 200.0 g |
| 3-methacryloxypropyltrimethoxysilane | 40.0 g |
| Methacryloxypropyl-tris-trimethylsiloxysilane | 20.0 g |
| 4-hydroxyphenyl vinyl ketone | 20.0 g |
| Glycidyl methacrylate | 20.0 g |
| 2,2'-azobis(2,4-dimethylvaleronitrile) | 5.0 g |

After being treated by the same way as that of Synthesis Example 1, the copolymer (A3) is obtained, and the weight average molecular weight thereof determined by the GPC analysis (with polyoxyethylene as the standard) is 6,000.

Synthesis Example 4

Synthesis of Copolymer (A4)

The copolymer (A4) was synthesized by the same way as that of Synthesis Example 1, in which the following ingredients were fed at the following weight to perform the polymerization.

| | |
|---|---|
| Methyl 3-methoxypropionate | 200.0 g |
| Methacryloxypropyl-tris-trimethylsiloxysilane | 50.0 g |
| 4-hydroxyphenyl vinyl ketone | 30.0 g |
| (2-ethyl-2-oxetanyl)methyl methacrylate | 20.0 g |
| 2,2'-azobis(2,4-dimethylvaleronitrile) | 5.0 g |

After being treated by the same way as that of the Synthesis Example 1, the copolymer (A4) is obtained, and the weight average molecular weight thereof determined by the GPC analysis (with polyoxyethylene as the standard) is 5,100.

Synthesis Example 5

Synthesis of Copolymer (A5)

The copolymer (A5) was synthesized by the same way as that of Synthesis Example 1, in which the following ingredients were fed at the following weight to perform the polymerization.

| | |
|---|---|
| Methyl 3-methoxypropionate | 200.0 g |
| 3-methacryloxypropyltrimethoxysilane | 40.0 g |
| Glycidyl methacrylate | 60.0 g |
| 2,2'-azobis(2,4-dimethylvaleronitrile) | 5.0 g |

After being treated by the same way as that of Synthesis Example 1, the copolymer (A5) is obtained, and the weight average molecular weight thereof determined by the GPC analysis (with polyoxyethylene as the standard) is 4,700.

Synthesis Example 6

Synthesis of Copolymer (A6)

The copolymer (A6) was synthesized by the same way as that of Synthesis Example 1, in which the following ingredients were fed at the following weight to perform the polymerization.

| | |
|---|---|
| Methyl 3-methoxypropionate | 200.0 g |
| 3-methacryloxypropyltrimethoxysilane | 40.0 g |
| 4-hydroxyphenyl vinyl ketone | 15.0 g |
| 3,4-epoxycyclohexylmethyl methacrylate | 45.0 g |
| 2,2'-azobis(2,4-dimethylvaleronitrile) | 5.0 g |

After being treated by the same way as that of Synthesis Example 1, the alkali-soluble copolymer (A6) is obtained, and the weight average molecular weight thereof determined by the GPC analysis (with polyoxyethylene as the standard) is 5,100.

Synthesis Example 7

Synthesis of Alkali-Soluble Copolymer (C1)

The alkali-soluble copolymer (C1) was synthesized by the same way as that of Synthesis Example 1, in which the following ingredients were fed at the following weight to perform the polymerization.

| | |
|---|---|
| Methyl 3-methoxypropionate | 200.0 g |
| Dicyclopentanyl methacrylate | 50.0 g |
| N-phenyl maleimide | 30.0 g |
| Methacrylic acid | 20.0 g |
| 2,2'-azobis(2,4-dimethylvaleronitrile) | 5.0 g |

After being treated by the same way as that of Synthesis Example 1, the alkali-soluble copolymer (C1) is obtained, and the weight average molecular weight thereof determined by the GPC analysis (with polyoxyethylene as the standard) is 8,900.

Synthesis Example 8

Synthesis of Alkali-Soluble Copolymer (C2)

The alkali-soluble copolymer (C2) was synthesized by using the same device as that of Synthesis Example 1, and the following ingredients with methyl 3-methoxypropionate as a polymerization solvent was used and heated at 80° C. for 4 hrs, to perform the polymerization.

| | |
|---|---|
| Methyl 3-methoxypropionate | 200.0 g |
| Dicyclopentanyl methacrylate | 65.0 g |
| Methacrylic acid | 35.0 g |
| 2,2'-azobis(2,4-dimethylvaleronitrile) | 5.0 g |

After being treated by the same way as that of Synthesis Example 1, the alkali-soluble copolymer (C2) is obtained, and the weight average molecular weight thereof determined by the GPC analysis (with polyoxyethylene as the standard) is 7,600.

Synthesis Example 9

Synthesis of Alkali-Soluble Copolymer (C3)

The alkali-soluble copolymer (C3) was synthesized by the same way as that of Synthesis Example 1, in which the following ingredients were fed at the following weight to perform the polymerization.

| | |
|---|---|
| Methyl 3-methoxypropionate | 200.0 g |
| 3-methacryloxypropyltrimethoxysilane | 40.0 g |
| N-cyclohexyl maleimide | 50.0 g |
| Methacrylic acid | 10.0 g |
| 2,2'-azobis(2,4-dimethylvaleronitrile) | 5.0 g |

After being treated by the same way as that of Synthesis Example 1, the alkali-soluble copolymer (C3) is obtained, and the weight average molecular weight thereof determined by the GPC analysis (with polyoxyethylene as the standard) is 8,300.

Synthesis Example 10

Synthesis of Alkali-Soluble Copolymer (C4)

The alkali-soluble copolymer (C4) was synthesized by the same way as that of Synthesis Example 1, in which the following ingredients were fed at the following weight to perform the polymerization.

| | |
|---|---|
| Methyl 3-methoxypropionate | 200.0 g |
| 3-methacryloxypropyltrimethoxysilane | 35.0 g |
| N-cyclohexyl maleimide | 40.0 g |
| 4-hydroxyphenyl vinyl ketone | 25.0 g |
| 2,2'-azobis(2,4-dimethylvaleronitrile) | 5.0 g |

After being treated by the same way as that of Synthesis Example 1, the alkali-soluble copolymer (C4) is obtained, and the weight average molecular weight thereof determined by the GPC analysis (with polyoxyethylene as the standard) is 8,600.

Comparative Synthesis Example 1

Synthesis of Comparative Copolymer (D1)

The comparative copolymer (D1) was synthesized by the same way as that of Synthesis Example 1, in which the following ingredients were fed at the following weight to perform the polymerization.

| | |
|---|---|
| Methyl 3-methoxypropionate | 200.0 g |
| Methacrylic acid | 20.0 g |
| Glycidyl methacrylate | 40.0 g |
| 3-ethyl-3-methacryloxymethyloxetane | 20.0 g |
| N-cyclohexyl maleimide | 20.0 g |
| 2,2'-azobis(2,4-dimethylvaleronitrile) | 5.0 g |

After being treated by the same way as that of Synthesis Example 1, the comparative copolymer (D1) is obtained, and the weight average molecular weight thereof determined by the GPC analysis (with polyoxyethylene as the standard) is 6,200.

Comparative Synthesis Example 2

Synthesis of Comparative Copolymer (D2)

The comparative copolymer (D2) was synthesized by the same way as that of Synthesis Example 1, in which the following ingredients were fed at the following weight to perform the polymerization.

| | |
|---|---|
| Methyl 3-methoxypropionate | 200.0 g |
| Methacrylic acid | 15.0 g |
| Glycidyl acrylate | 50.0 g |
| N-phenyl maleimide | 25.0 g |
| Dicyclopentanyl methacrylate | 10.0 g |
| 2,2'-azobis(2,4-dimethylvaleronitrile) | 5.0 g |

After being treated by the same way as that of Synthesis Example 1, the comparative copolymer (D2) is obtained, and the weight average molecular weight thereof determined by the GPC analysis (with polyoxyethylene as the standard) is 7,900.

Comparative Synthesis Example 3

Synthesis of Comparative Copolymer (D3)

The comparative copolymer (D3) was synthesized by the same way as that of Synthesis Example 1, in which the following ingredients were fed at the following weight to perform the polymerization.

| | |
|---|---|
| Methyl 3-methoxypropionate | 200.0 g |
| Methyl methacrylate | 50.0 g |
| Glycidyl methacrylate | 50.0 g |
| 2,2'-azobis(2,4-dimethylvaleronitrile) | 5.0 g |

After being treated by the same way as that of Synthesis Example 1, the comparative copolymer (D3) is obtained, and the weight average molecular weight thereof determined by the GPC analysis (with polyoxyethylene as the standard) is 7,800.

Example 1

Preparation of the Positive Type Photosensitive Resin Composition

The copolymer (A1) obtained in Synthesis Example 1 includes a condensate of 4,4'-[1-[4-[1-[4-hydroxyphenyl]-1-methylethyl]phenyl]ethylidene]bisphenol with 1,2-naphthoquinonediazido-5-sufonyl chloride (at an average esterification rate of 58%, also called as "PAD" hereinafter) as a 1,2-quinonediazido compound, fluorinated surfactant of Megaface R-08 (briefly called as R-08 hereinafter) manufactured by Dainippon Ink and Chemicals Incorporated Co., Ltd. as an additive, and methyl 3-methoxypropionate as a solvent, which were mixed and dissolved at the following weight, to get the positive type photosensitive resin composition.

| | |
|---|---|
| Methyl 3-methoxypropionate | 1.40 g |
| Solution of the copolymer (A1) of 30 wt % | 10.00 g |
| PAD | 0.60 g |
| R-08 | 0.006 g |

[Evaluation of the Positive Type Photosensitive Resin Composition]

1) Formation of the Patterned Transparent Film

The positive type photosensitive resin composition synthesized in Embodiment 1 was spin coated on a glass substrate for 10 seconds at a coating speed of 800 rpm and dried on a hot plate at 100° C. for 2 min. By using a PROXYMITI exposure machine TME-150PRC (manufactured by TOPCON Co., Ltd.), the substrate was exposed under g-line, h-line, and i-line obtained after the lights with a wavelength less than or equal to 350 nm being cut off by a wavelength cut-off filter, with a exposure slot of 100 μm, by using a mask with hole patterns. The amount of exposure was detected by an accumulated meter UIT-201 and a photosensitive detector TVD-365PD (manufactured by USHIO Electric Co., Ltd.), and the result was 150 mJ/cm². The glass substrate after exposure was immersed in an aqueous solution of tetramethylammonium hydroxide to be developed for 60 seconds, so as to remove the resin composition at the exposed part. The substrate after the development is washed with pure water for 60 seconds, and dried on a hot plate at 100° C. for 2 min. The whole substrate was exposed by using the above exposure machine without using a mask at an exposure amount of 300 mJ/cm², and then post-baked in an oven at 230° C. for 30 min, so as to form a patterned transparent film with a thickness of 3 μm. The thickness were respectively detected at three positions on the film by using a probe type film thickness meter alpha STEP 200 (manufactured by KLA-Tencor Co., Ltd., Japan), and the average value thereof was taken as the film thickness.

2) Film Residue Rate after Development

The film thickness was respectively detected before and after the development, and the film residue rate was calculated by the following formula:

(Film Thickness after Development/Film Thickness before Development)×100(%).

3) Resolution

The substrate with the patterned transparent film obtained in 1) after being post-baked was observed with an optical microscope at an amplification of 400 to determine the size of the mask with glass being exposed at the bottom layer of the hole pattern. The condition without hole patterns being formed was recorded at NG (No Good).

4) Transparency

The light transmission at a wavelength of 400 nm was detected by using TC-1800 (manufactured by Tokyo Denshoku Co., Ltd.) with a glass substrate without a transparent film formed thereon as a standard.

5) Solvent Resistance

The substrate with a patterned transparent film obtained in 1) was immersed in N-methyl-2-pyrrolidone at 100° C. for 5 min to detect the change in the film thickness. The film thickness was respectively detected before and after immersing, and the rate of film thickness change was calculated by the following formula:

(Film Thickness after Immersing/Film Thickness before Immersing)×100(%).

If the rate of film thickness change falls within a range of −2% to 2%, the solvent resistance is determined to be Good (G). If the rate of film thickness change exceeds 2% due to swelling or it is lower than −2% due to dissolution, the solvent resistance is determined to be NG.

6) Acid Resistance

The substrate with a patterned transparent film obtained in 1) was immersed in hydrochloric acid/nitric acid/water=4/2/4 (weight ratio) at 50° C. for 3 min to detect the change in film thickness. The film thickness was respectively detected before and after immersing, and the rate of film thickness change was calculated by the following formula:

(Film Thickness after Immersing/Film Thickness before Immersing)×100(%).

If the rate of film thickness change falls within the range of −2% to 2%, the 15 acid resistance is determined to be Good (G). If the rate of film thickness change exceeds 2% due to swelling or it is lower than −2% due to dissolution, the acid resistance is determined to be NG.

7) Alkali Resistance

The substrate with a patterned transparent film obtained in 1) was immersed in a 5% aqueous solution of potassium hydroxide at 60° C. for 10 min to detect the change in film thickness. The film thickness was respectively detected before and after immersing, and the rate of film thickness change was calculated by the following formula:

(Film Thickness after Immersing/Film Thickness before Immersing)×100(%).

If the rate of film thickness change falls within the range of −2% to 2%, the alkali resistance is determined to be Good (G). If the rate of film thickness change exceeds 2% due to swelling or it is lower than −2% due to dissolution, the alkali resistance is determined to be NG.

8) Heat Resistance

The substrate with a patterned transparent film obtained in 1) was additionally baked in an oven at 230° C. for another 1 hr, and the light transmission thereof was respectively detected by the same manner as that of 4) before and after heating. The light transmission after post-baking (before the additional baking) is T1, the light transmission after the additional baking is T2. The less the light transmission is reduced from that obtained after post-baking to that after additional baking, the better the heat resistance is. The film thickness was respectively detected before and after heating, and the rate of film thickness change was calculated by the following formula:

(Film Thickness after Additional Baking/Film Thickness after Post-baking)×100(%).

9) Adhesive Properties

The substrate with the patterned transparent film obtained in 1) was evaluated by a substrate mesh stripping test (cross-cut test). The number of residual substrate meshes per 100 square substrate meshes, each substrate mesh at the unit of 1 mm, after stripping was evaluated.

10) Sputtering Resistance

At 200° C., an indium tin oxide (ITO) transparent electrode with a film thickness of 150 nm was formed by sputtering on the substrate with a patterned transparent film obtained in 1), and after returning to the room temperature, the film surface was observed with naked eyes to determine whether the film was corrugated or not. If the film surface was not corrugated, the sputtering resistance is determined to be Good (G); whereas if the film surface was corrugated, the sputtering resistance is determined to be NG.

11) Dielectric Constant

Electrodes were respectively formed on and below the transparent film by using LCR meter (4284A) manufactured by Agilent Technology Company, so as to measure the dielectric constant, which is evaluated at 1 kHz.

The positive type photosensitive resin composition synthesized in Example 1 is evaluated by the above evaluation method. The results are listed in Table 1.

TABLE 1

|  | Example 1 | Example 2 | Example 3 | Example 4 | Example 5 |
|---|---|---|---|---|---|
| Rate of Film Residue After Development (%) | 92.9 | 94.2 | 95.2 | 94.5 | 94.7 |
| Resolution (μm) | 7 | 7 | 7 | 7 | 7 |
| Film Thickness after Post-baking (μm) | 3.06 | 3.05 | 2.99 | 3.05 | 3.00 |
| Light Transmission Rate T1 (%) | 97.5 | 97.7 | 98.0 | 97.7 | 97.9 |
| Solvent Resistance | 99.8 | 100 | 100 | 100 | 99.9 |
| Acid Resistance | 100 | 100 | 101 | 101 | 100 |
| Alkali Resistance | 101 | 101 | 101 | 100 | 100 |
| Light Transmission Rate T2 (%) | 97.3 | 97.5 | 97.8 | 97.4 | 97.8 |
| Film Thickness after Additional Baking (μm) | 2.97 | 3.00 | 2.94 | 3.01 | 2.95 |
| Heat Resistance (Rate of Film Thickness Change, %) | 97.1 | 98.4 | 98.3 | 98.7 | 98.3 |
| Adhesive Properties | 100 | 100 | 100 | 100 | 100 |
| Sputtering Resistance | G | G | G | G | G |
| Dielectric Constant | 3.6 | 3.3 | 2.9 | 3.1 | 3.3 |

Example 2

The positive type photosensitive resin composition in this Example was prepared by the same way as that of Example 1, except that the mixture of the copolymer (A2) obtained in Synthesis Example 2 and the alkali-soluble copolymer (C1) obtained in Synthesis Example 7 at 1:1 was used to replace the copolymer (A1) in Example 1, and then the positive type photosensitive resin composition in this Example was evaluated. The results were listed in Table 1.

Example 3

The positive type photosensitive resin composition in this Example was prepared by the same way as that of Example 1, except that the mixture of the copolymer (A3) obtained in Synthesis Example 3 and the alkali-soluble copolymer (C2) obtained in Synthesis Example 8 at 1:1 was used to replace the copolymer (A1) in Example 1, and then the positive type photosensitive resin composition in this Example was evaluated. The results were listed in Table 1.

Example 4

The positive type photosensitive resin composition in this Example was prepared by the same way as that of Example 1, except that the mixture of the copolymer (A4) obtained in Synthesis Example 4 and the alkali-soluble copolymer (C3) obtained in Synthesis Example 9 at 1:1 was used to replace the copolymer (A1) in Example 1, and then the positive type photosensitive resin composition in this Example was evaluated. The results were listed in Table 1.

Example 5

The positive type photosensitive resin composition in this Example was prepared by the same way as that of Example 1, except that the mixture of the copolymer (A5) obtained in Synthesis Example 5 and the alkali-soluble copolymer (C4) obtained in Synthesis Example 10 at 1:1 was used to replace the copolymer (A1) in Example 1, and then the positive type photosensitive resin composition in this Example was evaluated. The results were listed in Table 1.

Comparative Example 1

The positive type photosensitive resin composition was prepared by the same way as that of Example 1, except that the mixture of the comparative copolymer (D1) obtained in Comparative Synthesis Example 1 and the alkali-soluble copolymer (C1) obtained in Synthesis Example 7 at 1:1 was used to replace the copolymer (A1) in Example 1, and then the positive type photosensitive resin composition was evaluated. The results were listed in Table 2.

TABLE 2

|  | Comparative Example 1 | Comparative Example 2 | Comparative Example 3 |
|---|---|---|---|
| Rate of Film Residue after Development (%) | 92.1 | 93.5 | 93.7 |
| Resolution (μm) | 8 | 8 | NG |
| Film Thickness after Post-baking (μm) | 3.00 | 2.98 | 3.02 |
| Light Transmission Rate T1 (%) | 93.8 | 91.5 | 92.9 |
| Solvent Resistance | 99.4 | 99.5 | 100.3 |
| Acid Resistance | 100.7 | 100.6 | 101.1 |
| Alkali Resistance | 101.3 | 101.5 | 101.3 |
| Light Transmission Rate T2 (%) | 90.2 | 89.4 | 86.2 |
| Film Thickness after Additional Baking (μm) | 2.89 | 2.85 | 2.94 |
| Heat Resistance (Rate of Film Thickness Change, %) | 96.3 | 95.6 | 97.4 |
| Adhesive Properties | 100 | 100 | 100 |
| Sputtering Resistance | NG | NG | NG |
| Dielectric Constant | 3.9 | 3.7 | 3.7 |

Comparative Example 2

The positive type photosensitive resin composition was prepared by the same way as that of Example 1, except that the mixture of the comparative copolymer (D2) obtained in Comparative Synthesis Example 2 and the alkali-soluble copolymer (C2) obtained in Synthesis Example 8 at 1:1 was used to replace the copolymer (A1) in Example 1, and then the positive type photosensitive resin composition was evaluated. The results were listed in Table 2.

Comparative Example 3

The positive type photosensitive resin composition was prepared by the same way as that of Example 1, except that the mixture of the comparative copolymer (D3) obtained in Comparative Synthesis Example 3 and the alkali-soluble copolymer (C1) obtained in Synthesis Example 7 at 1:1 was used to replace the copolymer (A1) in Example 1, and then the positive type photosensitive resin composition was evaluated. The results were listed in Table 2.

The positive type photosensitive resin composition of the invention may be used in, for example, LCD devices.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A positive type photosensitive resin composition, comprising a copolymer (A) and a 1,2-quinonediazido compound (B), wherein the copolymer (A) is obtained by polymerizing free radical polymerizable monomers (a1) of general formula (I) with other free radical polymerizable monomers (a2):

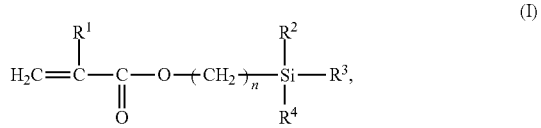

(I)

wherein $R^1$ is hydrogen or an alkyl group having 1-5 carbon atoms in which any hydrogen may be replaced by fluorine, and $R^2$, $R^3$, and $R^4$ are independently hydroxyl group, an alkyl group having 1-5 carbon atoms, an alkoxyl group having 1-5 carbon atoms or —O(Si($C_lH_{2l+1}$)$_2$O)$_m$Si($C_pH_{2p+1}$)$_3$, wherein l is an integer of 1-5, m is 0 or an integer of 1-10, n is an integer of 1-5, and p is an integer of 1-5; and wherein the other free radical polymerizable monomers (a2) are selected from free radical polymerizable monomers having phenolic OH of a general formula (II):

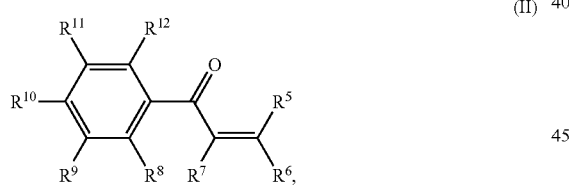

(II)

wherein in the general formula (II), $R^5$, $R^6$, and $R^7$ are independently hydrogen or an alkyl group having 1-3 carbon atoms in which any hydrogen may be replaced by fluorine, $R^8$, $R^9$, $R^{10}$, $R^{11}$, and $R^{12}$ are independently hydrogen, halogen, —CN, —CF$_3$, —OCF$_3$, —OH, an alkyl group having 1-5 carbon atoms in which any —CH$_2$— may be replaced by —COO—, —OCO—, —CO— or any hydrogen may be replaced by halogen, or an alkoxyl group having 1-5 carbon atoms in which any hydrogen may be replaced by halogen, wherein at least one of $R^8$, $R^9$, $R^{10}$, $R^{11}$, and $R^{12}$ is —OH.

2. The positive type photosensitive resin composition according to claim 1, further comprising an alkali-soluble copolymer (C), wherein the alkali-soluble copolymer (C) is obtained by polymerizing at least one of free radical polymerizable monomers having unsaturated carboxylic acid, free radical polymerizable monomers having unsaturated carboxylic anhydride, and free radical polymerizable monomers having phenolic OH.

3. The positive type photosensitive resin composition according to claim 1, wherein the other free radical polymerizable monomers (a2) further comprise at least one of free radical polymerizable monomers having epoxy group.

4. The positive type photosensitive resin composition according to claim 2, wherein the other free radical polymerizable monomers (a2) further comprise at least one of free radical polymerizable monomers having epoxy group.

5. The positive type photosensitive resin composition according to claim 1, wherein the other free radical polymerizable monomers (a2) further comprises at least one of free radical polymerizable monomers having unsaturated carboxylic acid, free radical polymerizable monomers having unsaturated carboxylic anhydride.

6. The positive type photosensitive resin composition according to claim 2, wherein the other free radical polymerizable monomers (a2) further comprises at least one of free radical polymerizable monomers having unsaturated carboxylic acid, free radical polymerizable monomers having unsaturated carboxylic anhydride.

7. The positive type photosensitive resin composition according to claim 2, wherein the alkali-soluble copolymer (C) is obtained by polymerizing free radical polymerizable monomers having phenolic OH of the general formula (II):

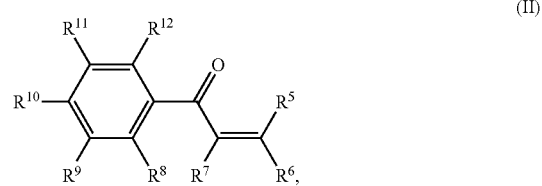

(II)

wherein in the general formula (II), $R^5$, $R^6$, and $R^7$ are independently hydrogen or an alkyl group having 1-3 carbon atoms in which any hydrogen may be replaced by fluorine, $R^8$, $R^9$, $R^{10}$, $R^{11}$, and $R^{12}$ are independently hydrogen, halogen, —CN, —CF$_3$, —OCF$_3$, —OH, an alkyl group having 1-5 carbon atoms in which any —CH$_2$— may be replaced by —COO—, —OCO—, —CO— or any hydrogen may be replaced by halogen, or an alkoxyl group having 1-5 carbon atoms in which any hydrogen may be replaced by halogen, wherein at least one of $R^8$, $R^9$, $R^{10}$, $R^{11}$, and $R^{12}$ is —OH.

8. The positive type photosensitive resin composition according to claims 6, wherein the alkali-soluble copolymer (C) is obtained by polymerizing free radical polymerizable monomers having phenolic OH of the general formula (II):

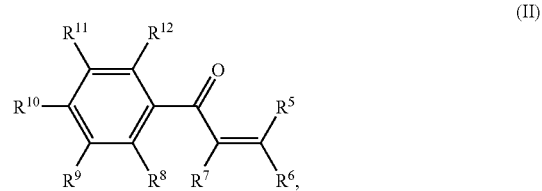

(II)

wherein in the general formula (II), $R^5$, $R^6$, and $R^7$ are independently hydrogen or an alkyl group having 1-3 carbon atoms in which any hydrogen may be replaced by fluorine, $R^8$, $R^9$, $R^{10}$, $R^{11}$, and $R^{12}$ are independently hydrogen, halogen, —CN, —CF$_3$, —OCF$_3$, —OH, an alkyl group having 1-5 carbon atoms in which any —CH₂— may be replaced by —COO—, —OCO—, —CO— or any hydrogen may be replaced by halogen, or an alkoxyl group having 1-5 carbon atoms in which any hydrogen may be replaced by halogen, wherein at least one of $R^8$, $R^9$, $R^{10}$, $R^{11}$, and $R^{12}$ is —OH.

9. The positive type photosensitive resin composition according to claim 2, wherein the alkali-soluble copolymer (C) is obtained by polymerizing free radical polymerizable monomers of the general formula (I):

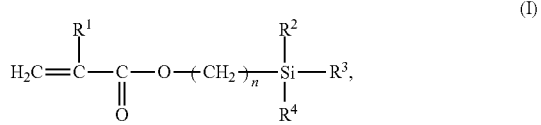

wherein $R^1$ is hydrogen or an alkyl group having 1-5 carbon atoms in which any hydrogen may be replaced by fluorine, and $R^2$, $R^3$, and $R^4$ are independently hydroxyl group, an alkyl group having 1-5 carbon atoms, an alkoxyl group having 1-5 carbon atoms or —O(Si(C$_l$H$_{2l+1}$)$_2$O)$_m$Si(C$_p$H$_{2p+1}$)$_3$, wherein l is an integer of 1-5, m is 0 or an integer of 1-10, n is an integer of 1-5, and p is an integer of 1-5.

10. The positive type photosensitive resin composition according to claim 1, wherein the free radical polymerizable monomers (a1) comprise at least one of 3-methacryloxypropyltrimethoxysilane and methacryloxypropyl-tris-trimethylsiloxysilane.

11. The positive type photosensitive resin composition according to claim 2, wherein the free radical polymerizable monomers (a1) comprise at least one of 3-methacryloxypropyltrimethoxysilane and methacryloxypropyl-tris-trimethylsiloxysilane.

12. The positive type photosensitive resin composition according to claim 3, wherein the free radical polymerizable monomers having epoxy group comprises at least one of glycidyl (meth)acrylate, methylglycidyl (meth)aclylate, 3,4-epoxycyclohexylmethyl (meth)acrylate, 3-methyl-3-(meth)acryloxymethyloxetane, 3-ethyl-3-(meth)acryloxymethyloxetane, 3-methyl-3-(meth)acryloxyethyloxetane, and 3-ethyl-3-(meth)acryloxyethyloxetane.

13. The positive type photosensitive resin composition according to claim 4, wherein the free radical polymerizable monomers having epoxy group comprises at least one of glycidyl (meth)acrylate, methylglycidyl (meth)acrylate, 3,4-epoxycyclohexylmethyl(meth)acrylate, 3-methyl-3-(meth)acryloxymethyloxetane, 3-ethyl-3-(meth)acryloxymethyloxetane, 3-methyl-3-(meth)acryloxyethyloxetane, and 3-ethyl-3-(meth)acryloxyethyloxetane.

14. The positive type photosensitive resin composition according to claim 1, wherein the other free radical polymerizable monomers (a2) further comprise at least one of (meth)acrylic acid, maleic anhydride, hydroxystyrene, and 4-hydroxyphenyl vinyl ketone.

15. The positive type photosensitive resin composition according to claim 2, wherein the other free radical polymerizable monomers (a2) further comprise at least one of (meth)acrylic acid, maleic anhydride, hydroxystyrene, and 4-hydroxyphenyl vinyl ketone.

16. The positive type photosensitive resin composition according to claim 2, wherein the alkali-soluble copolymer (C) is obtained by polymerizing one or more free radical polymerizable monomers selected from (meth)acrylic acid, maleic anhydride, hydroxystyrene, and 4-hydroxyphenyl vinyl ketone.

17. The positive type photosensitive resin composition according to claim 2, wherein the alkali-soluble copolymer (C) comprises at least one of free radical polymerizable monomers having N-substituted maleimide and free radical polymerizable monomers having dicyclopentanyl group.

18. The positive type photosensitive resin composition according to claim 17, wherein N-substituted maleimide comprises at least one of N-methyl maleimide, N-ethyl maleimide, N-butyl maleimide, N-cyclohexyl maleimide, N-benzyl maleimide, N-phenyl maleimide, N-(4-acetylphenyl) maleimide, N-(2,6-diethylphenyl) maleimide, N-(4-dimethylamino-3,5-dinitrophenyl) maleimide, N-(1-anilinonaphthyl-4) maleimide, N-[4-(2-benzoxazolyl)phenyl] maleimide, and N-(9-acridinyl) maleimide.

19. The positive type photosensitive resin composition according to claim 17, wherein the free radical polymerizable monomers having dicyclopentanyl group are dicyclopentanyl (meth)acrylate.

* * * * *